(12) United States Patent
Higashi et al.

(10) Patent No.: US 6,583,383 B2
(45) Date of Patent: Jun. 24, 2003

(54) METHOD AND APPARATUS FOR CUTTING A SEMICONDUCTOR WAFER

(75) Inventors: Mitsutoshi Higashi, Nagano (JP); Hideaki Sakaguchi, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 83 days.

(21) Appl. No.: 09/847,193

(22) Filed: May 2, 2001

(65) Prior Publication Data

US 2001/0040152 A1 Nov. 15, 2001

(30) Foreign Application Priority Data

May 9, 2000 (JP) ........................................ 2000-136084

(51) Int. Cl.$^7$ ............................................... B23K 26/00
(52) U.S. Cl. ............................ 219/121.72; 219/121.84; 219/121.67; 219/121.85; 219/121.69
(58) Field of Search ................... 219/121.72, 121.84, 219/121.67, 121.85, 121.69; 65/174

(56) References Cited

U.S. PATENT DOCUMENTS

| 4,239,567 | A | | 12/1980 | Winings | |
|---|---|---|---|---|---|
| 4,689,467 | A | * | 8/1987 | Inoue | 219/121 L |
| 5,776,220 | A | * | 7/1998 | Allaire et al. | 65/112 |
| 5,902,499 | A | | 5/1999 | Richerzhagen | |
| 5,916,460 | A | * | 6/1999 | Imoto et al. | 219/121.67 |
| 6,204,472 | B1 | * | 3/2001 | Muzzi et al. | 219/121.67 |

FOREIGN PATENT DOCUMENTS

| DE | 3809921 | 10/1989 |
|---|---|---|
| EP | 0947300 | 10/1999 |
| EP | 1139415 | 3/2000 |

OTHER PUBLICATIONS

International search report on application EP–01–11–1016.

* cited by examiner

Primary Examiner—M. Alexandra Elve
(74) Attorney, Agent, or Firm—Paul & Paul

(57) ABSTRACT

A method for cutting a semiconductor wafer is provided. A mount tape is adhered to a back surface of the semiconductor wafer. The mount tape comprises a resin base and a mesh-like member made of a material harder than that of the resin base and embedded in the resin base. A beam-like liquid jet is ejected toward a front surface of the semiconductor wafer and, simultaneously, a laser beam is transmitted axially through said beam-like liquid jet, so that the semiconductor wafer is cut into individual pieces, by said laser beam, together with the resin base of the mount tape, while the mesh-like member is not cut, but remains in its connected state.

7 Claims, 4 Drawing Sheets

METHOD AND APPARATUS FOR CUTTING A SEMICONDUCTOR WAFER

BACKGROUND OF THE INVENTION

1. Field of the Invention

The present invention relates to a method and an apparatus for cutting a semiconductor wafer and, more particularly to a method and an apparatus for cutting a semiconductor wafer, adhered to a mount tape, into individual pieces by a cutter.

2. Description of the Related Art

Generally, as shown in FIG. 7, a semiconductor element used for a semiconductor device is supplied by cutting a silicon wafer 12 (hereinafter referred merely to a "wafer" 12), on which a plurality of semiconductor elements 13 are formed, into individual pieces.

When the semiconductor elements 13 of the wafer 12 are initially cut into individual pieces, a back surface of the wafer 12 is adhered to a mount tape 100 mainly composed of a resin with an adhesive layer 14, as shown in FIG. 8.

Then, the mount tape 100 on which the wafer 12 is adhered is placed on a stage surface of a stage 102 and cut with a rotating blade 104 as shown in FIG. 9, wherein a predetermined gap H is maintained between the stage surface of the stage 102 and the rotating blade 104.

By cutting the wafer 12 while maintaining the predetermined gap H between the stage surface of the stage 102 and the rotating blade 104, as shown in FIG. 10, cut grooves 106 are formed by the rotating blade 104. While the semiconductor elements 13 of the wafer 12 are separated from each other by the cut grooves 106, the mount tape 100 is not completely cut and individual cut semiconductor elements are still adhered to the mount tape. Therefore, the cut semiconductor elements 13 are prevented from scattering during and/or after cutting, whereby the cutting operation and the post treatment are facilitated.

In this regard, the thickness of the wafer 12 has recently been reduced, resulting in a lowering of wafer strength. Thereby, it has been found that cracks or chipped portions are generated in the wafer 12 when cut by the rotating blade 104.

The inventors of the present invention believe that such cracks or chipped portions are caused by a shearing force applied to the wafer 12 when the wafer 12 is cut by the rotating blade 104, and have tried to cut the wafer 12 with a laser beam.

However, the inventors of the present invention have found that, if the laser beam is used for cutting the wafer 12 into individual semiconductor elements 13, the mount tape 100 is also cut into pieces.

The inventors then tried to cut the semiconductor elements 13 on the wafer 12 into individual pieces and half-cut the mount tape 100 with a laser beam, and found that it is necessary to delicately adjust an output of the laser beam if a desirable cut groove 106 as shown in FIG. 10 is to be formed and that the heat generation is problematic in the cutting of wafer with the laser beam, which means that the cutting of the wafer 12 with the laser beam is not industrially advantageous.

Although there are various problems in the prior art method for cutting the wafer 12 with the laser beam as described above, this method is advantageous because it is free from the generation of cracks and/or chipped portions caused by the cutting of wafer 12, since no large shearing force is applied onto the wafer 12 unlike the cutting with the rotating blade 104.

SUMMARY OF THE INVENTION

An object of the present invention is to provide a method for easily cutting a wafer with a laser beam.

The present inventors have studied the above-mentioned problems of the prior art and found that it is possible to cut the wafer while removing heat generated in a cut area during the cutting operation, if the laser beam cutter ejects a beam-like water jet having a predetermined width corresponding to a slit to be cut to an area of the wafer to be cut, while directing a laser beam axially through the beam-like water jet.

Also the inventors have found that, by using a mount tape in which is embedded a mesh-like member formed of material harder than a main resin component of the mount tape, it is possible, even though the mount tape is cut into pieces, to prevent the individual cut pieces from scattering about because the mesh-like member is not cut and connects the cut pieces with each other. Thus, the present invention was completed.

According to the present invention, there is provided a method for cutting a semiconductor wafer, the method comprising the following steps of: adhering a mount tape on a back surface of said semiconductor wafer, said mount tape comprising a resin base and a mesh-like member made of a material harder than that of said resin base and embedded in said resin base; and ejecting a beam-like liquid jet toward a front surface of said semiconductor wafer and simultaneously transmitting a laser beam axially through said beam-like liquid jet, so that said semiconductor wafer is cut into individual pieces by said laser beam together with said resin base of the mount tape, while said mesh-like member remains in its connected state. In this case, the pressure of said beam-like liquid jet and the output of said laser beam is determined in such a manner that said semiconductor wafer is sufficiently cut, while the mesh-like member of the mount tape is not cut, but remains in its connected state.

According to the present invention, since a liquid beam having a width corresponding to a desired slit width to be cut is ejected on an area of a wafer to be cut and, simultaneously a laser beam is axially directed through the beam-like liquid to the area of the wafer to be cut, it is possible to remove heat, generated during the cutting with the laser beam, by the beam-like liquid, as well as to minimize the shearing force applied to the wafer in comparison with a case wherein the wafer is cut with a rotating blade.

Further, according to the present invention, an assembly of a wafer adhered to a mount tape in which is embedded a mesh-like member formed of material harder than a main resin component of the mount tape is cut with a laser beam transmitted axially through the beam-like liquid jet ejected to have a width corresponding to a desired slit width to be cut.

When the wafer and the mount tape are cut as described above, a portion of the mesh-like member in the cut slit is not cut but left as it is. Therefore, the mesh-like member connects the individually cut pieces with each other to prevent the cut pieces from being scattered about. As a result, the cutting operation and the post treatment can easily be carried out.

The beam-like liquid jet is a pressurized pure water jet and focused so as to have a diameter in a range of 30 to 50 $\mu$m, so that said semiconductor wafer cuts along a slit having a corresponding width.

The said mesh-like member is a glass cloth made of glass filament. In this case, the glass cloth comprises a plurality of lateral filaments and a plurality of transverse filaments substantially extending perpendicularly to the lateral filaments, so that the semiconductor wafer is cut along a slit which extends so as not to be in parallel to said lateral or said transverse filaments. In this case, the semiconductor wafer is preferably cut along a slit which extends at an angle of 30 to 60 degree to said lateral and said transverse filaments. A total thickness of the mount tape is in a range from 80 to 100 μm and a diameter of the glass fiber is in a range from 20 to 90 μm.

According to another aspect of the present invention, there is provided an apparatus for cutting a semiconductor wafer comprising: a mount tape comprising a resin base and a mesh-like member made of a material harder than that of the resin base and embedded in the resin base; first means for holding the mount tape, to which a back surface of the semiconductor wafer is adhered, second means for ejecting a beam-like liquid jet toward a front surface of the semiconductor wafer and simultaneously transmitting a laser beam axially through the beam-like liquid jet; and means for moving at least one of the first and second means, so that the semiconductor wafer is cut into individual pieces by the laser beam together with the resin base of the mount tape, while the mesh-like member remains in its connected state.

DETAILED DESCRIPTION OF THE DRAWINGS

Figure 1:
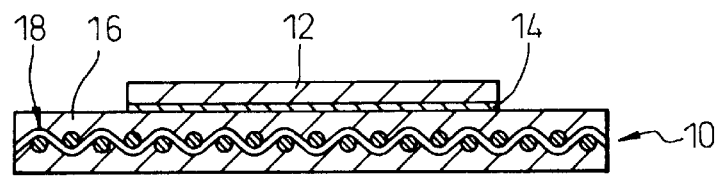
FIG. 1 is a sectional view of a wafer adhered to a mount tape used in the present invention.

As shown in FIG. 1, a mount tape 10 used in the present invention is mainly made of polyimide resin 16 and has a mesh-like member 18 formed of a material harder than the resin. The mesh-like member shown in FIG. 1 is a glass cloth 18 formed of glass filaments. The glass cloth 18 is woven with glass filaments in a plain weave. Such a glass cloth 18 is embedded horizontally all over the mount tape 10 and generally at a central position in the thickness direction thereof.

As shown in FIG. 1, a back surface of a wafer 12 is adhered via an adhesive layer 14 to one surface of the mount tape 10 carrying the glass cloth 18. The adhesive layer 14 is composed of an ultraviolet-curing resin.

While the glass cloth 18 exists all over the mount tape 10 in the embodiment shown in FIG. 1, it may be provided solely in an area where the wafer 12 is to be adhered.

Also, the mount tape 10 may be mainly composed of an ultraviolet-curing resin. In such a case, the wafer 12 can be adhered with the same ultraviolet-curing resin as that of the mount tape 10.

Figure 2:
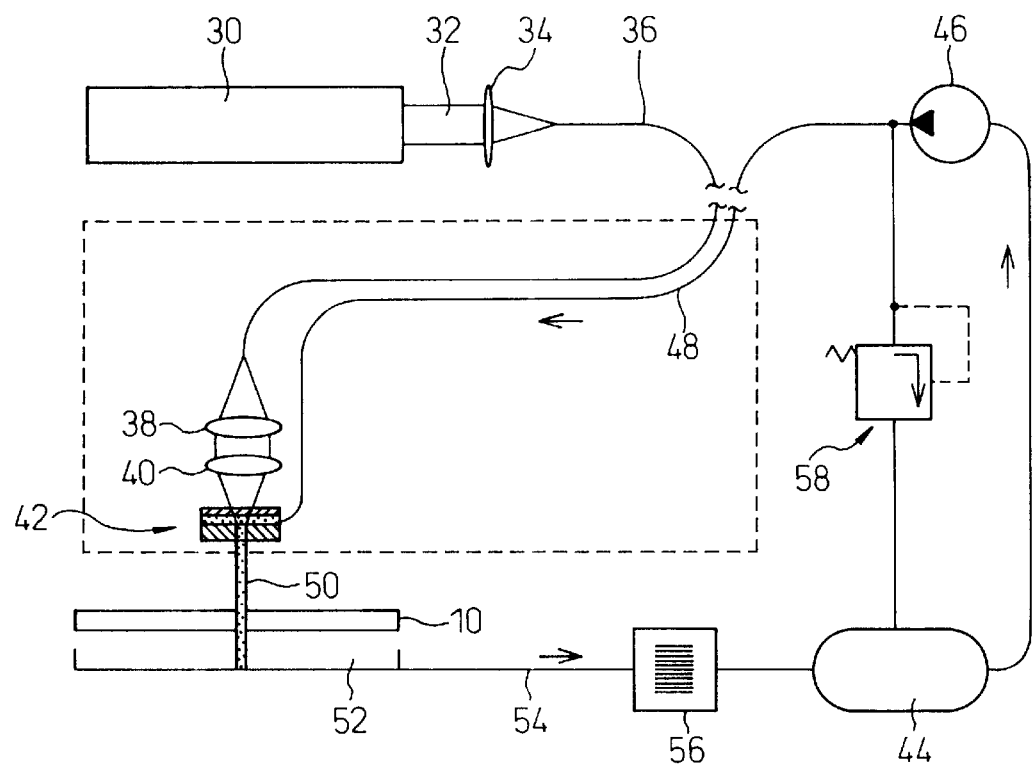
FIG. 2 is a schematic view of a laser cutter used in the present invention.

The assembly of the wafer 12 and the mount tape 10 shown in FIG. 1 is cut by using a laser cutter, shown in FIG. 2, such as that disclosed in W0 95/32834 (U.S. Pat. No. 5,902,499).

In the laser cutter shown in FIG. 2, a laser beam 32 generated by a laser beam generator 30 is transmitted via a focussing unit 34 for focussing the beam to a point in the vicinity of a collimater 38. The laser beam transmitted through an optical fiber 36 is parallelized by the collimater 38 and then focussed via a focussing lens 40 onto an opening of the nozzle section 42.

Water (favorably pure water) stored in a tank 44 is delivered to the nozzle section 42 after being pressurized to a predetermined level (approximately 30 MPa) by a pump 46 and ejected as a beam-like water jet 50 having a diameter in a range from approximately 30 to 50 μm. The laser beam focussed by a focussing lens 40 is output from an exit opening of the nozzle section 42 and transmitted axially through the beam-like water jet 50 while repeating an internal total reflection in the beam-like water jet 50.

Water forming the beam-like water jet 50 is returned to the tank 44, for the purpose of reuse, through a pipe 54 and a filter 56 after being once collected into a receptacle 52.

In this regard, there is a safety valve 58 in a piping 48 on the output side of the pump 46.

When the wafer 12 and the mount tape 10 shown in FIG. 1 are cut by means of the laser cutter shown 2, the mount tape 10 carrying the wafer 12 (hereinafter this assembly is referred merely to a "mount tape" 10) is inserted midway in the passage of the beam-like water jet 50, and moves the mount tape 10 so that the beam-like water jet traces a line on the wafer 12 to be cut, during which a laser beam is directed to the line to be cut axially through the beam-like water jet 50.

The position at which the mount tape 10 is to be inserted may be any position within approximately 10 cm from the output opening for the beam-like water jet 50 in the nozzle section 42, preferably at a position approximately 5 cm farther from the output opening for the beam-like water jet 50.

Figure 3:
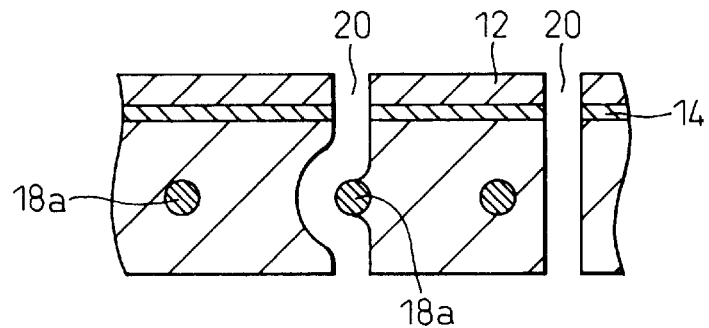
FIGS. 3 and 4 are an enlarged partial sectional view and an overall sectional view, respectively, of the wafer and the mount tape cut with the laser cutter shown in FIG. 2.
Figure 9:
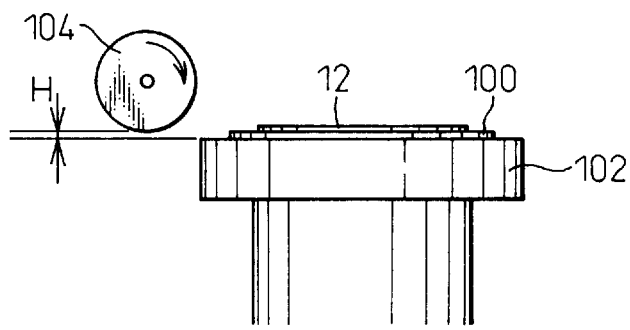
FIG. 9 is a schematic view of a prior art cutter.
Figure 10:
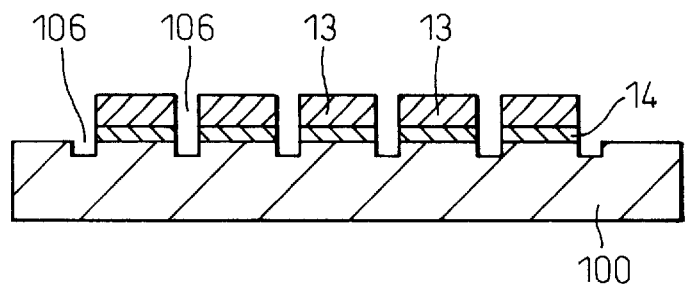
FIG. 10 is a sectional view of a wafer and a mount tape cut with the prior art cutter shown in FIG. 8.

In such a manner, the mount tape 10 and the wafer 12 inserted midway of the beam-like water jet 50 are cut while leaving a slit 20 having a width generally equal to a diameter of the beam-like water jet 50 as shown in FIG. 3. Since the cutting of the mount tape 10 and the wafer 12 is carried out by a laser beam transmitted through the beam-like water jet 50, the wafer 12 can be cut without receiving a large shearing force as when the rotating blade 104 is used for this purpose, as shown in FIG. 9. Accordingly, the wafer 12 is free from cracks or other damage caused by the shearing force generated during the cutting operation. Also, since heat generated during the cutting by the laser beam is quickly removed by the beam-like water jet 50, the wafer 12 is hardly influenced thereby.

In addition, as shown in FIG. 3, when there is no glass filament 18a in an area of the mount tape 10 in which the slit 20 is to be cut with a laser beam, a slit 20 of a linear shape is formed.

On the other hand, when there is a glass filament 18a in an area of the mount tape 10 in which the slit 20 is to be cut with a laser beam, the laser beam cuts a resin portion softer than the glass filament 18a. Thus, the glass filament 18a is not cut and is left in the slit 20 as it is.

Figure 4:
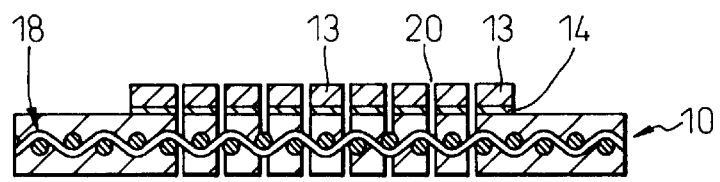

Accordingly, when the wafer 12 and the mount tape 10 are cut with the laser cutter shown in FIG. 2, the glass cloth 18 is not cut as shown in FIG. 4, whereby the cut pieces of the wafer 12 and the mount tape 10 carrying individual semiconductor elements 13 are maintained in a connected state.

Figure 5:
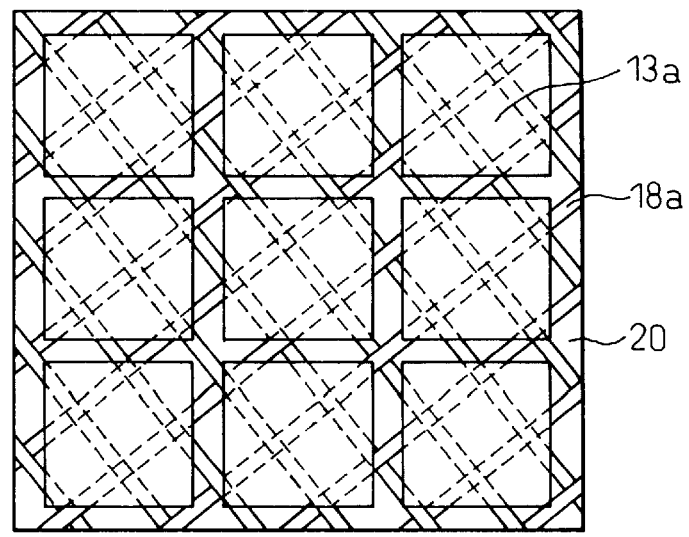
FIG. 5 is a plan view illustrating the arrangement of slits for cutting the wafer into individual pieces and a mesh-like member of glass filaments.

As a result, since the cut pieces are prevented from scattering about, the cutting operation of the wafer 12 and the mount tape 10 and the post treatment can be easily and effectively carried out, FIG. 5 shows the arrangement of the slits 20 cutting the wafer 12 into individual semiconductor elements 13 and the glass filaments 18a. As illustrated, it is preferable that the orientation of a mesh of the glass filaments 18a and that of the slits 20 do not coincide with each other. Practically, the glass filament 18a makes an angle in a range from 30 to 60 degrees relative to the slits 20. A suitable number of glass filaments 18a in an area of the individual semiconductor 13 is approximately one/mm. Since a total thickness of the mount tape 10 is generally in a range from 80 to 100 $\mu$m, a diameter of the glass filament 18a preferably in a range from 20 to 90 $\mu$m. The diameter of the glass filament is preferably as small as possible provided the strength of the mount tape 10 is maintained even after the cutting.

Figure 6:
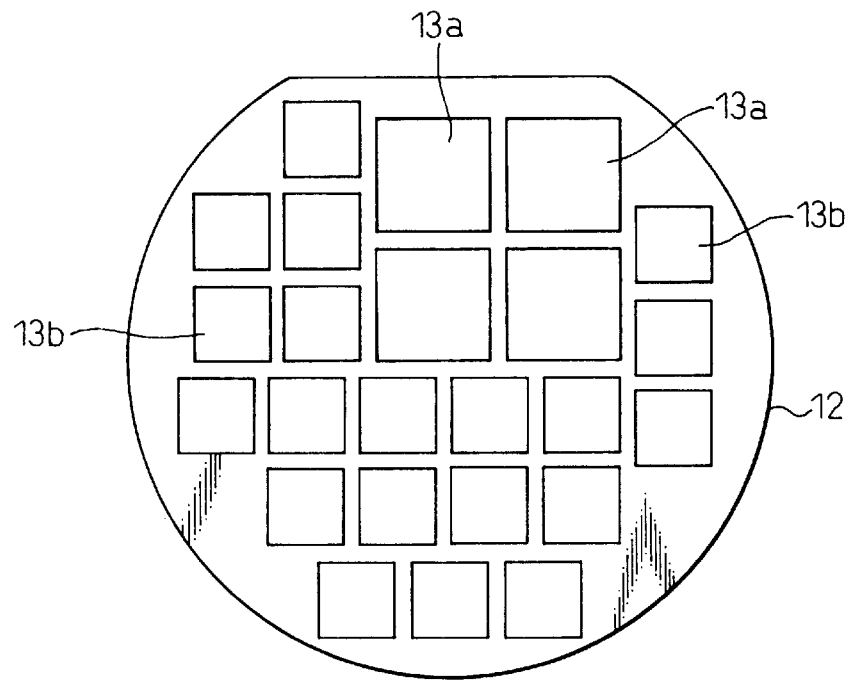
FIG. 6 is a plan view of a wafer illustrating one example of the arrangement of semiconductor elements to be cut from the wafer.
Figure 7:
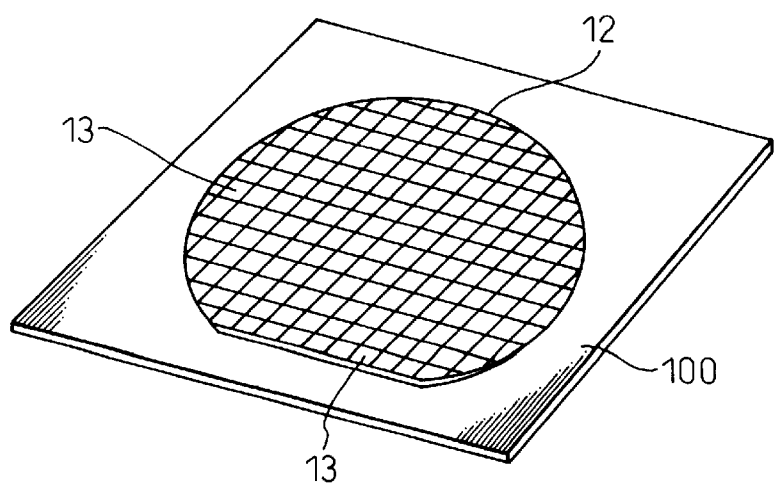
FIG. 7 is a perspective view of a wafer adhered to a mount tape.
Figure 8:
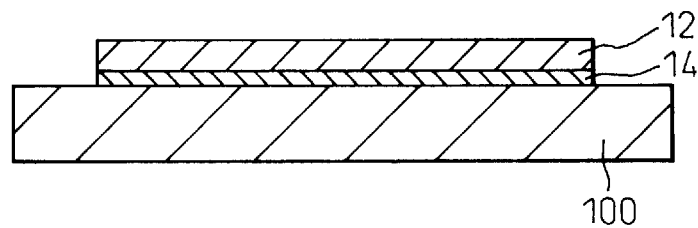
FIG. 8 is a sectional view of a wafer adhered to a prior art mount tape.

According to the present invention, since the laser cutter shown in FIG. 2 is used, the wafer 12 may be cut along a complicated cutting slit, for example, a crank-shaped slit. Thus it is possible to cut semiconductor elements 13 of different sizes from the same wafer 12 as shown in FIG. 6.

To release the semiconductor element 13 from the individual cut piece, the ultraviolet-curing resin for adhering the semiconductor element 13 is deteriorated by the irradiation with ultraviolet rays.

While pure water is used as liquid for the beam-like liquid jet 50 in the above description, another transparent liquid may be used such as alcohol or others. The transparency is not indispensable, however, because it is sufficient that the liquid of the beam-like jet can transmit a laser beam of a specific wavelength.

If the pressure of the beam-like water jet 50 output from the nozzle section 42 is excessively high, there is a risk in that the wafer 12 may be cut by the water jet 50, whereby the pressure is preferably adjusted to a proper level at which the wafer 12 is not cut.

Similarly, if the output of the laser beam is excessively high, there is a risk in that the mesh-like member such as glass cloth 18 may be cut, whereby the output of the laser beam preferably adjusted to a proper level at which the mesh-like member is not cut.

While a glass cloth is used as a mesh-like member in the above description, another material, such as a metallic cloth composed of metallic fibers or a non-woven cloth composed of glass fibers or metallic fibers, may be used.

According to the present invention, it is possible to reduce a shearing force applied to a wafer when it is cut and to minimize the adverse effect thereof on the semiconductor element thus cut, whereby the yield of the semiconductor element can be improved.

Further, it is possible to prevent the cut pieces from scattering about during the cutting operation and the post treatment, whereby the cutting operation and the post treatment can be facilitated to result in the improvement in productivity of semiconductor devices.

It will be understood by those skilled in the art that the foregoing description relates to only a preferred embodiment of the disclosed invention, and that various changes and modifications may be made to the invention without departing the sprit and scope thereof.

What is claimed is:

1. A method for cutting a semiconductor wafer, said method comprising the following steps of:

adhering a mount tape on a back surface of said semiconductor wafer, said mount tape comprising a resin base and a mesh-like member made of a material harder than that of said resin base and embedded in said resin base; and ejecting a beam-like liquid jet toward a front surface of said semiconductor wafer and simultaneously transmitting a laser beam axially through said beam-like liquid jet, so that said semiconductor wafer is cut into individual pieces by said laser beam together with said resin base of the mount tape, while said mesh-like member remains in its connected state.

2. A method as set forth in claim 1, wherein said beam-like liquid jet is a pressurized pure water jet and is focused so as to have a diameter in a range of 30 to 50 $\mu$m, so that said semiconductor wafer is cut along a slit having a corresponding width.

3. A method as set forth in claim 1, wherein said mesh-like member is a glass cloth made of glass filaments.

4. A method as set forth in claim 3, wherein said glass cloth comprises a plurality of lateral filaments and a plurality of transverse filaments extending substantially perpendicularly to the lateral filaments, so that said semiconductor wafer is cut along a slit which extends so as not to be in parallel to said lateral and said transverse filaments.

5. A method as set forth in claim 4, wherein said semiconductor wafer is cut along a slit which extends at an angle of 30 to 60 degree to said lateral and said transverse filaments.

6. A method as set forth in claim 2, wherein a total thickness of said mount tape is in a range from 80 to 100 $\mu$m and a diameter of said glass fiber is in a range from 20 to 90 $\mu$m.

7. A method as set forth in claim 1, wherein a pressure of said beam-like liquid jet and an output of said laser beam is determined in such a manner that said semiconductor wafer is sufficiently cut, while the mesh-like member of the mount tape is not cut, but remains in its connected state.

* * * * *